United States Patent
Shiu et al.

(10) Patent No.: US 12,142,507 B2
(45) Date of Patent: *Nov. 12, 2024

(54) SYSTEMS AND METHODS FOR AIR FLOW OPTIMIZATION IN ENVIRONMENT FOR SEMICONDUCTOR DEVICE

(71) Applicant: Taiwan Semiconductor Manufacturing Company, Ltd., Hsinchu (TW)

(72) Inventors: Yi-Fam Shiu, Miaoli County (TW); Cheng-Lung Wu, Miaoli County (TW); Yang-Ann Chu, Hsinchu (TW); Hsu-Shui Liu, Taoyuan County (TW); Jiun-Rong Pai, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/358,517

(22) Filed: Jul. 25, 2023

(65) Prior Publication Data

US 2023/0386877 A1    Nov. 30, 2023

Related U.S. Application Data

(63) Continuation of application No. 17/465,040, filed on Sep. 2, 2021, now Pat. No. 11,735,455.

(60) Provisional application No. 63/200,530, filed on Mar. 12, 2021.

(51) Int. Cl.
*H01L 21/677* (2006.01)
*H01L 21/673* (2006.01)

(52) U.S. Cl.
CPC .. *H01L 21/67772* (2013.01); *H01L 21/67393* (2013.01); *H01L 21/67781* (2013.01)

(58) Field of Classification Search
CPC ......... H01L 21/67017; H01L 21/67778; H01L 21/67781; H01L 21/67772; H01L 21/67389; H01L 21/67775; H01L 21/67393
See application file for complete search history.

(56) References Cited

U.S. PATENT DOCUMENTS

| | | | |
|---|---|---|---|
| 5,876,280 | A | 3/1999 | Kitano et al. |
| 7,217,076 | B2 | 5/2007 | Bonora et al. |
| 8,616,821 | B2 | 12/2013 | Ku et al. |
| 9,579,697 | B2 | 2/2017 | Hsu et al. |
| 10,115,607 | B2 | 10/2018 | Bao et al. |
| 2006/0120833 | A1 | 6/2006 | Bonora et al. |

(Continued)

FOREIGN PATENT DOCUMENTS

| KR | 20070024637 A | 3/2007 |
|---|---|---|
| KR | 20150136484 A | 12/2015 |

(Continued)

*Primary Examiner* — Glenn F Myers
(74) *Attorney, Agent, or Firm* — Haynes and Boone, LLP

(57) ABSTRACT

A system comprises a front opening universal pod (FOUP) configured to hold one or more semiconductor wafers and a load dock having a stage and a receiving portion extending above the stage. The FOUP is positioned on the stage. A fan filter unit (FFU) positioned above the load dock. An air flow optimizer device is disposed on the receiving portion and under the FFU. The air flow optimizer device has an inlet opening and an outlet opening and a channel extends between the inlet opening and the outlet opening.

20 Claims, 13 Drawing Sheets

(56) References Cited

U.S. PATENT DOCUMENTS

| | | | |
|---|---|---|---|
| 2008/0304944 A1 | 12/2008 | Sung et al. |
| 2015/0024671 A1 | 1/2015 | Taniyama et al. |
| 2016/0293454 A1 | 10/2016 | Hiroki |
| 2017/0207191 A1 | 7/2017 | Huang et al. |
| 2019/0109213 A1 | 4/2019 | Tsai et al. |
| 2020/0234988 A1 | 7/2020 | Lin |

FOREIGN PATENT DOCUMENTS

| | | |
|---|---|---|
| KR | 20170003211 U | 9/2017 |
| KR | 20190006395 A | 1/2019 |
| TW | 202036708 A | 10/2020 |

SYSTEMS AND METHODS FOR AIR FLOW OPTIMIZATION IN ENVIRONMENT FOR SEMICONDUCTOR DEVICE

PRIORITY CLAIM

The present application is a continuation application of U.S. patent application Ser. No. 17/465,040, filed Sep. 2, 2021, issuing as U.S. Pat. No. 11,735,455, which claims priority to a provisional application Ser. No. 63/200,530, filed Mar. 12, 2021, which are hereby incorporated by reference in their entireties.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. As the scaling down of the semiconductor fabrication processes becomes more aggressive, the storage and transport of semiconductor wafers may become more critical to avoid contamination. Thus, existing substrate transport techniques have not proved entirely satisfactory in all respects.

As scaling down occurs, it is also recognized that the tolerable defect size and quantity is also reduced. In order to avoid contamination and exposure to environmental affects, substrates on which semiconductor devices are formed may be placed in a Front Opening Unified Pod or Front Opening Universal Pod (FOUP) for transportation and holding between fabrication processes and as such, between fabrication equipment or tools The FOUP can provide not only mechanical stability, but also provide a suitable environment for the storage and transport of the substrates such as a controlled environment.

Similarly, the equipment and including the loading modules to the fabrication as similarly kept in a controlled environment ensuring a clean air atmosphere to prevent contamination. Providing an air curtain within the environment is one means of prevent contamination, which prevents adhesion of particles or the like to a surface of the substrate or the equipment. However, existing transportation and handling processes and systems to avoid contamination, exposure to unwanted atmospheric elements (e.g., moisture, oxygen) have not always been successful in sufficiently protection the substrates.

BRIEF DESCRIPTION OF THE DRAWINGS

The present disclosure is best understood from the following detailed description when read with the accompanying figures. It is emphasized that, in accordance with the standard practice in the industry, various features are not drawn to scale. The dimensions of the various features may be arbitrarily increased or reduced for clarity of discussion.

DETAILED DESCRIPTION

Figure 1B:
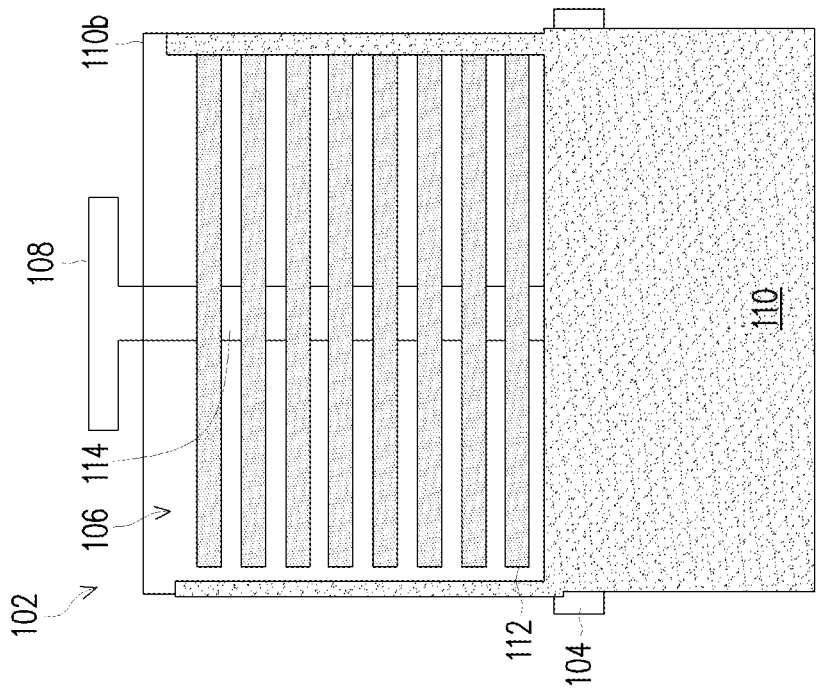
FIGS. 1A and 1B are diagram of an embodiment of a FOUP in accordance with aspects of the present disclosure.

The present disclosure includes embodiments of an air flow optimizer in an environment of a FOUP comprising substrates for semiconductor device fabrication. While the present disclosure is described in terms of semiconductor device substrates and a FOUP, it will be appreciated that the any device used for transporting or handling sensitive devices can benefit from the present invention. As but one example, transportation and storage of reticles or photomasks may similarly benefit as discussed below.

It is understood that the following disclosure provides many different embodiments or examples for implementing different features of the invention. Specific examples of components and arrangements are described below to simplify the present disclosure. These are merely examples and are not intended to be limiting. Some items are shown in a simplified form and inherently include components that are well known in the art. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor fabrication, more particularly to systems and methods for handling substrate carriers, such as FOUPs, during semiconductor fabrication.

In fabrication systems, it is typical for the fabrication equipment or tools to include or interface a front-end module (EFEM). The EFEM is a sub-system that interfaces with the various processing, measurement, and/or testing systems used in semiconductor device fabrication. The EFEM includes components needed to unload a substrate (e.g., from a FOUP), deliver the substrate to a primary tool for processing/measurement/testing, and return the substrate to its carrier (e.g., FOUP) upon completion. The EFEM may be sub-system interfacing a processing tools that performs one or more processes in association with manufacturing semiconductor devices on substrates such as semiconductor wafers. The processes may include front end of line (FEOL) processing, middle end of line (MEOL) processing, and back end of line (BEOL) processing. For example, the processing may include substrate cleaning; material deposition such as epitaxy, chemical vapor deposition (CVD), physical vapor deposition (PVD), atomic layer deposition (ALD), and metal plating; etching such as dry etching, wet etching, reactive ion etching, and atomic layer etching (ALE); chemical mechanical planarization (CMP); baking; photoresist coating, exposing, developing, and ashing; measurement; and various other processes.

As features are scaling down in semiconductor fabrication, yields and throughput demand the substrates be kept in a controlled environment. An EFEM maintains a controlled environment between a storage/transport environment (e.g., FOUP) and a processing, test, measurement environment (e.g., semiconductor fabrication tool). For example, the interior of the chamber (e.g., substrate transport chamber) in the EFEM is kept in a clean air atmosphere by a down flow gas (also referred to as vertical down flow, or an air curtain). In some implementations, the down flow of gas is provided at a high level of cleanliness by introducing the air after it has been cleaned through a chemical filter or the like. The down flow of gas can prevent contamination due to adhesion of particles to the surface of a substrate during transport including transport through the EFEM chamber.

In some implementations however, when interfacing a substrate carrier or FOUP to the EFEM environment, the down flow gas may be agitated causing the agitated gas to enter the FOUP chamber. Introduction of gas from the down flow of the EFEM environment to the FOUP is likely to permit adhesion of moisture and/or oxygen onto the FOUP and/or onto the surface of a substrate within the FOUP. Introduction of moisture and/or oxygen can cause corrosion and oxidation, affecting device yield and performance. For example, if the down flow gas contains high-humidity gas, when the down flow gas enters the FOUP, residual by-products may result. As but one example, introduction of washes (e.g., water wash) of substrates within the fabrication processes may create higher humidity air increasing these risks.

While the present disclosure presents solutions to the air optimization flow with respect to a FOUP, an EFEM, and/or other fabrication equipment, one of ordinary skill would recognize other implementations. The disclosure includes various embodiments that a person of skill in the art would readily recognize can apply to other systems where a directional control of air flow may be desired. A risk of agitation of the down flow gas that would benefit from the control presented by the present disclosure is not limited to the presence of a FOUP and its open door, but may also be present from other components of the system such as a docking system, an adjacent loading system, equipment components, etc.

Thus, the present disclosure introduces a variety of air flow optimization devices and systems. In an embodiment, an object of the present disclosure is to avoid contamination of substrates stored in and/or transferred to/from the carriers. In an embodiment, an object of the present disclosure is to avoid introduction of environmental factors (e.g., air, humidity, contaminates) into the carriers. The disclosure provides example embodiments of systems and methods that prohibit or prevent down flow gas outside of the carrier (FOUP) from entering the carrier (FOUP) when a door of the carrier is opened, for example, during transport of substrates. In some implementations, the down flow gas is prevented or minimized from entering an adjacent chamber (e.g., chamber of the FOUP) by air flow optimization device(s). The present disclosure provides many benefits to semiconductor fabrication, not all embodiments provide for all benefits.

Figure 1A:
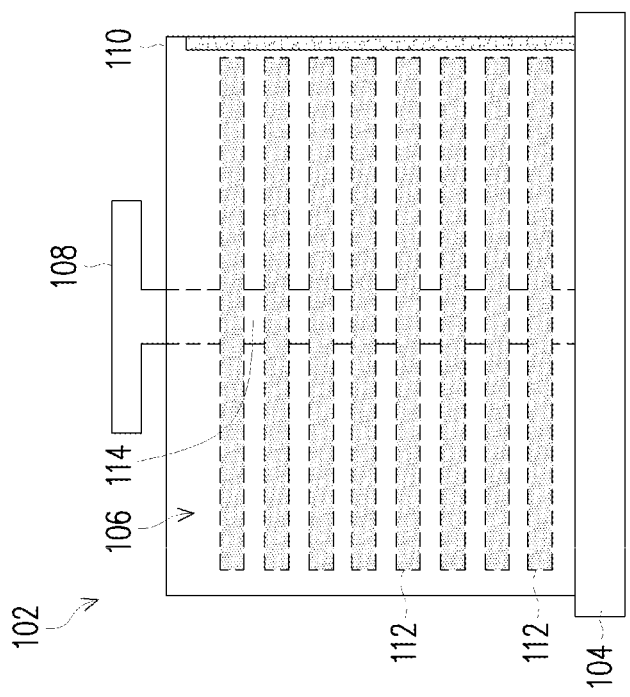

Referring now to FIG. 1A, illustrates is a substrate (e.g., wafer) carrier or FOUP 102. A substrate or a plurality of substrates is moved from one processing tool to another processing tool according to a fabrication flow. Typically, after a processing step, a substrate is removed from a process tool that performed the processing step and transferred to a FOUP where the substrate is temporarily stored until subsequent processing. The FOUP 102 provides an example of a substrate carrier suitable for transportation and storage of substrates. The FOUP 102 provides a protective enclosure for housing therein one or more substrates, such as 1, 12, 13, or 25 substrates or semiconductor wafers.

The FOUP 102 includes a base 104 and a plurality of sidewalls extending from the base 104 to a top surface defining a FOUP cavity 106. The FOUP cavity 106 holds one or more substrates 112, such as wafers, in its protected environment. Any number of substrates 112 may be included in the cavity 106 such as 25 substrates. The substrates 112 may be carried on a retaining feature 114. The retaining feature 114 may be a rack, bracket, shelf, clip, framework, or other feature to secure the substrates 112 during storage, transport and handling. The FOUP cavity 106 may have a generally rectangular shape. In some embodiments, the FOUP cavity 106 has curved upper corners. The FOUP 102 may be made of a rigid material to protect and securely hold the wafers inside, for example, plastic materials. In an embodiment, the FOUP cavity 106 provides an environment of a nitrogen atmosphere. In some implementations, the FOUP 102 includes various environmental sensors (e.g., temperature, humidity, etc.) and means for communicating readings from the sensors (e.g., RF). In some implementations, the FOUP 102 includes various filters or membranes to provide for the controlled environment.

In some embodiments, a flange or protrusion 108 is disposed on a top surface of the top of the FOUP 102. One or more handles may be disposed on the FOUP (not shown). In some embodiments, the FOUP 102 has various coupling plates, pins and holes to allow the FOUP 102 to be located on a load port, as discussed below, and/or to be manipulated by an automatic handling system of a fabrication system.

On at least one wall of the FOUP 102, there is a door 110. The door 110 is a portion of the FOUP 102 operable to provide a sealed environment of the FOUP cavity 106 during storage and/or transport, but be mechanically "opened"

when interfacing another system such as a EFEM. The door 110 when "opened" allows for one or more substrates 112 to be removed from the FOUP cavity 106. In some implementations, the door 110 includes gaskets or other devices providing an appropriate seal for the FOUP cavity 106.

In an embodiment, the substrate 112 is a semiconductor wafer such as a silicon wafer. Alternatively or additionally, substrate includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate is a semiconductor-on-insulator substrate, such as a silicon-on-insulator (SOI) substrate, a silicon germanium-on-insulator (SGOI) substrate, or a germanium-on-insulator (GOI) substrate. In some implementations, the substrate 112 is a 300 mm wafer, in some implementations, the substrate 112 is a 450 mm. However, other dimensions are also possible. While the present example is directed to a semiconductor substrate such as a wafer, in other embodiments, the FOUP 102 may include photomasks, reticles or other components.

FIG. 1B is a diagram showing a side view of the FOUP 102. As discussed above, the FOUP 102 includes the door 110, which is configured to be "opened" to provide access to the chamber 106 of the FOUP 102. When the door 110 is opened/removed (e.g., dropped up/down or moved aside), the cavity 106 is exposed. In the illustration of FIG. 1B, the door 110 is dropped downward, exposing the cavity 106 and the substrates 112. Attachment means 110B for the door 110 such as gasket, seals, etc. may be disposed on an edge of the FOUP 102.

When the door 110 is open, the cavity 106 of the FOUP 102 is exposed to external conditions and thus, the substrates 112 are potentially affected by the external conditions. As discussed above, in some implementations, the FOUP 102 is positioned interfacing a mini-environment such as an EFEM that includes a down flow of gas such as clean air or nitrogen. When the door 110 exposes the chamber 106, should the down flow of gas become agitated by the FOUP 102 itself or surrounding equipment, the gas flow may become oblique (slanted or diagonal) to the original vertical (down flow) direction and enter into the exposed chamber 106. Thus, what is needed to a system and method for reducing the risk of down flow of gas from entering the chamber 106, for example, when the door 110 is open.

Figure 2B:
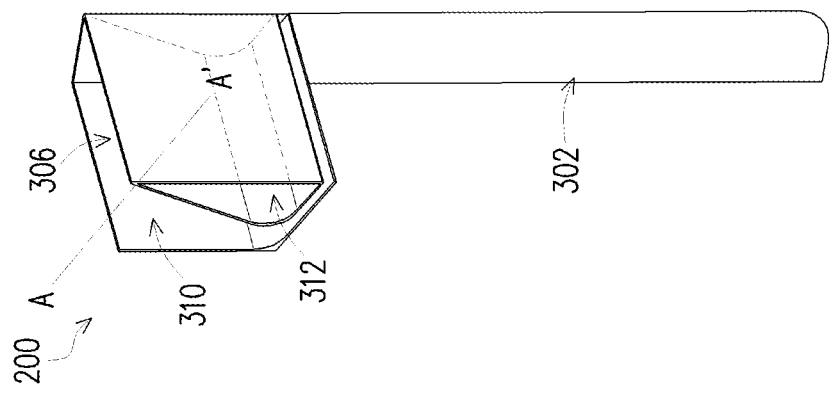
FIGS. 2A-2D are diagrammatic figures illustrating perspective views of embodiments of an air flow optimizer device in accordance with aspects of the present disclosure.
Figure 2A:
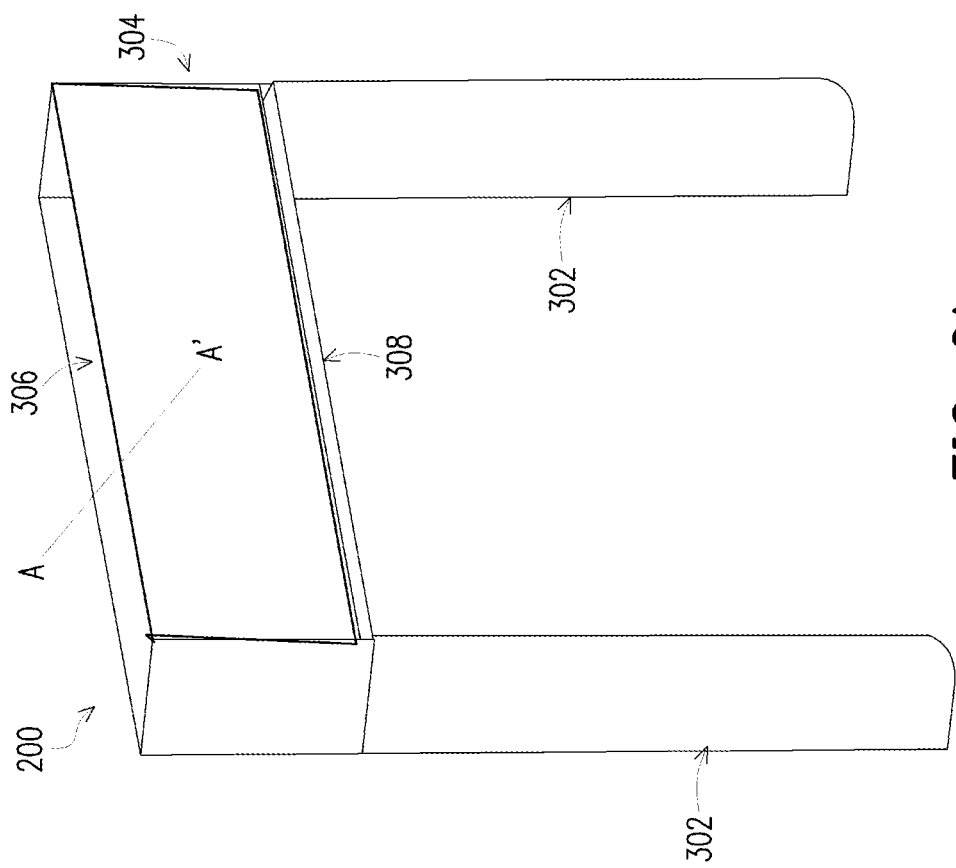
Figure 2C:
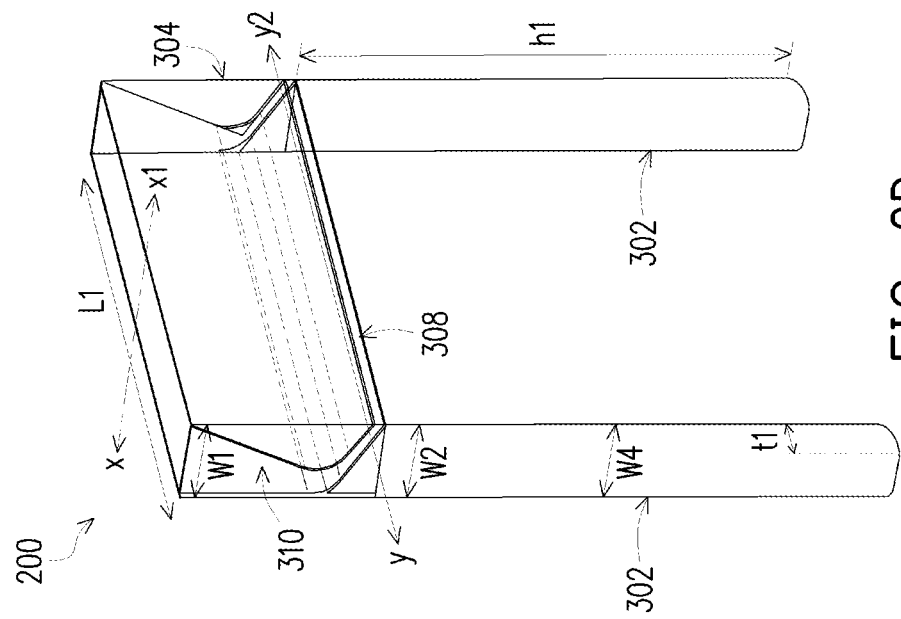

Referring now to FIGS. 2A, 2B and 2C, illustrated is an embodiment of an air flow optimizer device 200 according to one or more aspects of the present disclosure. FIG. 2A illustrates the air flow optimizer device 200 in perspective view. FIG. 2B illustrates the air flow optimizer device 200 at an A-A' cut. FIG. 3B illustrates a schematic view of the air flow optimizer device 200. As illustrated in FIGS. 2A, 2B, and 2C, the air flow optimizer device 200 includes a control device 304 and a plurality of extension plates 302. A first extension plate 302 extends from a first end of the control device 304 and a second extension plate 302 extends from a second end of the control device 304. The control device 304 intakes gas from an external gas flow, controls or governs the direction of intake gas, and/or outputs the directional controlled gas. In some implementations, the control device 304 modifies the flow rate of the gas for example increasing the flow rate from the intake gas to the output gas. For example, the control device 304 captures down flow gas (e.g., clean air) modifying its direction and/or flow rate. In some implementations, the control device 304 is positioned such that it directs down flow gas away from a component, such as away from a FOUP (e.g., away an exposed chamber of a FOUP).

In some implementations, the extension plates 302 are approximately rectangular-shape. In an embodiment, the extension plates 302 have a cross-sectional shape that is rectangular. In an embodiment, the extension plates 302 have a rectangular shaped face. The extension plates 302 may be operable to hold and affix the control device 304. In further implementations, the extension plates 302 block any lateral gas flow from a center region disposed between the extension plates 302.

The control device 304 includes an inlet opening 306 and an outlet opening 308. The inlet opening 306 is operable to accept gas flow, for example a down flow gas, into the control device 304. The outlet opening 308 is operable to release gas having traversed through the control device 304.

A channel 310 extends between the inlet opening 306 and the outlet opening 308 in the control device 304. The channel 310 provides a contiguous path for gas from the inlet opening 306 to the outlet opening 308. The channel 310 is defined by a partition 312. The partition 312 may be a thin material blocking a portion or portions of the control device 304 to define the path through which gas is funneled from the inlet opening 306 to the outlet opening 308. The partition 312 redirects gas from a vertical flow—as entering the inlet opening 306—to an oblique flow at the outlet opening 308. In some implementations, the partition 312 narrows the path through which the gas flows from a larger opening—inlet opening 306—to a smaller opening—outlet opening 308.

The air flow optimizer device 200 and components thereof may be comprised of aluminum, copper, ceramics, polymer, combinations thereof, and/or other suitable material. In some implementations, the components of the air flow optimizer device 200 may have the same composition as one another, for example, the control device 304 and the extension plates 302 may be a similar material (e.g., aluminum). In other implementations, the components of the air flow optimizer device 200 may have differing composition as one another, for example, the control device 304 and the extension plates 302 may comprise different materials (e.g., polymer and aluminum). In an embodiment, the partition 312 may be a same material as the outer walls of the control device 304.

FIG. 2C illustrates a down flow gas 314 entering the air flow optimizer device 200 and in particular, entering the inlet opening 306. The gas flow 314 is a vertically flowing gas. In some implementations, the gas flow 314 is a laminar gas flow. In some implementations, the gas flow 314 is provided by a fan filter unit (FFU). Other air sources are also possible. In some embodiments, the gas flow 314 is clean dry air or other suitable gas. In some implementations, the gas flow 314 may be flowing at a rate of greater than or equal to 0.05 meters (m)/second (s). The gas flow 314 enters the inlet opening 306 and travels through the channel 310 within the control device 304 to the outlet opening 308. The gas is then released from the air flow optimizer device 200 as outlet gas 316.

The outlet gas 316 has a directional flow controlled by the configuration of the channel 210 and the partition 312. In some implementations, the outlet gas 316 is directed such that it flows obliquely to the vertical down flow gas 314. In some implementations, the outlet gas 316 is at an angle A between 90 degrees and 15 degrees from vertical (e.g., flow direction of the inlet gas). In a further embodiment, the outlet gas 316 is at an angle A of approximately 45 degrees. In some implementations, the angle A provides for suitable angular flow such that agitation of the surrounding vertical flow is minimized and/or sufficient clearance between the outlet gas and the target area (e.g., opening of the FOUP) is achieved. In an embodiment, as the inlet opening 306 is larger in area than the outlet opening 308, the flow rate of the outlet gas 316 may be greater than the inlet gas 314.

Figure 2D:
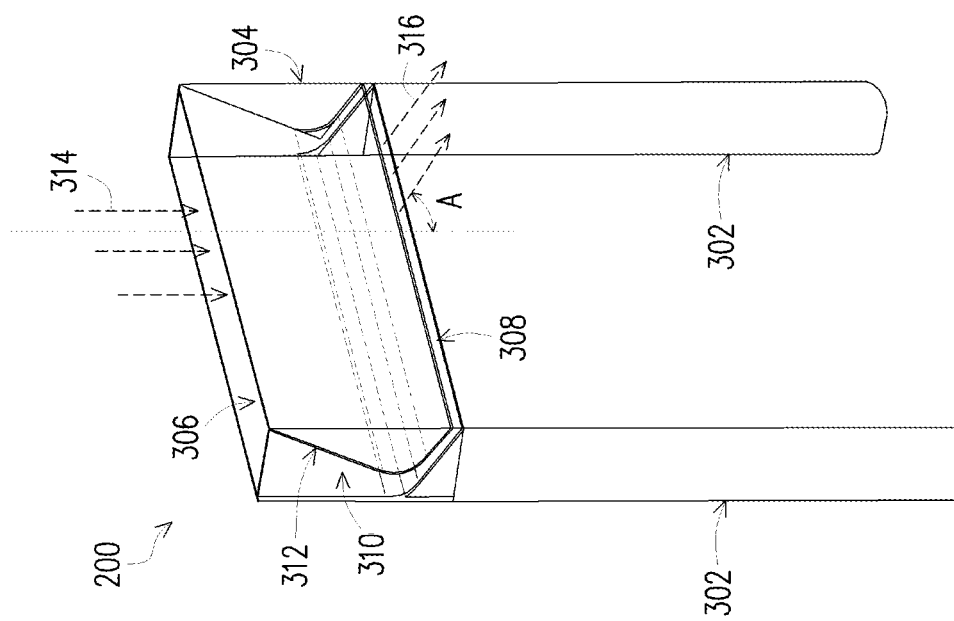
Figure 2E:
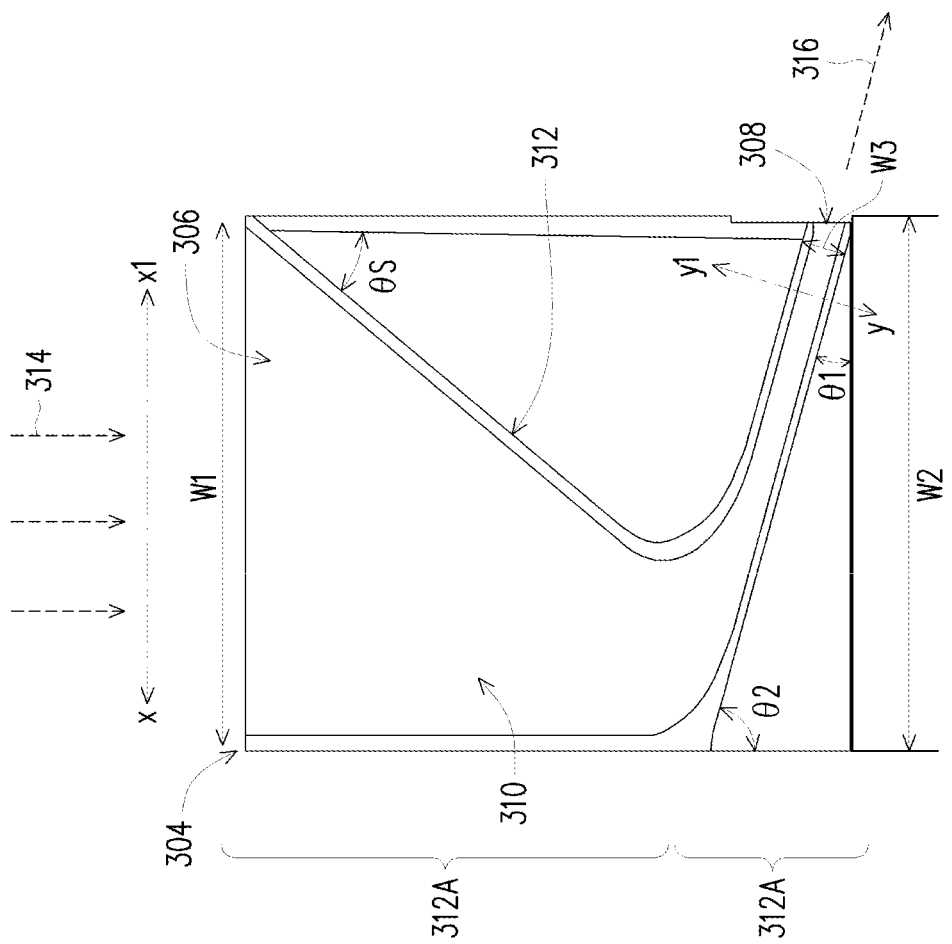
FIGS. 2E-2I are diagrammatic figures illustrating cross-sectional views of embodiments air flow optimizer devices in accordance with aspects of the present disclosure.

Referring now to FIGS. 2D and 2E, illustrated are additional details on an example of device 304. The following dimensions discussed are exemplary only and not intended to be limiting beyond what is specifically recited in the claims that follow.

In an embodiment, the extension plate(s) 302 has a width w4, a thickness t1 and a length or height h1. The width w4 is greater than the thickness t1. The height h1 is greater than the thickness t1 and/or the width w4. In an embodiment, the height h1 is greater than the height of the FOUP, such as the height of the FOUP 102 and in particular greater than height of an exposed portion of the chamber 106 when the door 110 is removed in the FOUP 102.

The control device 304 has a length L1 extending between the first and second extension plates 302. In an embodiment, the length L1 is greater than or equal to the dimension in a same plane of an exposed portion of the chamber 106 when the door 110 is removed in the FOUP 102. The control device 304 has a width w1 at a top and a width w2 at a bottom region. In some implementations, width w1 is approximately equal to width w2. In other implementations, the width w2 may be less than the width w1 for example, in implementations directed to increasing the flow rate of exiting gas. In an embodiment, the width w1 is a width of the inlet opening 306. In an embodiment, the length L1 is substantially equal to the length of the inlet opening 306 (e.g., minus small sidewalls defining the control device 304). In an embodiment, the width w1 is between approximately 2 centimeters (cm) and approximately 15 cm. In a further embodiment, the width w1 is approximately 7 cm.

In an embodiment, the extension plate has a width w4. In some implementations, the width w4 is approximately less than or equal to width w1. In an embodiment, w4 is approximately less than or equal to width w2.

In an embodiment, the outlet opening 308 has a width w3 defined by the partition 312. The width w1 may be greater than the width w3. The greater the width w1 in comparison with the width w3 (e.g., greater the ratio of w1:w3) the greater the flow rate of the outgoing gas 316 in comparison with the inlet gas 314. In an embodiment, the width w3 is between approximately 2 and 3 centimeters (cm). In an embodiment, the width w3 of the outlet opening 308 is between 10% and 90% less than width w1 of the inlet opening 306. In an embodiment, the outlet opening 308 extends approximately the length L1. Thus, the area available for outgoing gas may be w3 times approximately L1. In an embodiment, the area available for outgoing gas may be less than w3 times approximately L1, as the portion of control device 304 length (e.g., L1) available to the outgoing gas is less than its length, for example, 0.5*L1 such as discussed below. In some implementations, the area of the inlet opening 306 to the area of the outlet opening 308 is a ratio of 10:1 to 1:1.

The control device 304 also controls the directional flow of the outlet gas 316 exiting the outlet opening 308. In an embodiment, the partition 312 defines the directional flow (e.g., angle) of the outlet gas 316. In an embodiment, the partition 312 includes an upper portion 312A that provides a funnel-like shape reducing a width of the channel 310 within which the gas flows. In an implementation, the partition 312A includes a first side abutting and/or defining an outer sidewall of the control device 304. In an implementation, the partition 312A includes a second side extending from an outer sidewall of the control device 304 at the opening 306 to a midpoint within the control device 304. In some implementations, the second side is provided at an angle θs of approximately 20 to approximately 70 degrees with respect to the sidewall of the control device 304. The portion of the partition 312A may be referred to as the narrowing portion, as it narrows the channel 310. Thus, in an embodiment, the narrowing portion 312A of the partition 312 provides a channel 310 region that extends substantially vertically and decreases in dimension (e.g., width) from an upper region to a lower region.

In an embodiment, the partition 312 includes a lower portion 312B that modifies the direction of the channel 310 and thus, the direction of the gas flow within the channel 310. In an implementation, the partition 312B includes a first side extending from abutting the sidewall of the control device 304 to the outlet opening 308 at the opposing sidewall of the control device 304. In an implementation, the partition 312B includes a second side extending from a midpoint within the control device 304 to the outlet opening 308. In some implementations, the second side is provided substantially parallel to the first side of the partition 312B. The portion of the partition 312B may be referred to as the directional portion, as it orients the channel 310 to provide and define the directional flow of the outlet gas 316.

As illustrated in FIG. 2E, the directional portion 312B of the partition 312 is defined by a first angle θ1 and a second angle θ2. In an embodiment, first angle θ1 is less than or equal to 60 degrees. In an embodiment, second angle θ2 is less than approximately 90 degrees and/or greater than or equal to approximately 30 degrees. The angles θ1 and θ2 are selected to control the outlet gas 316 directional flow. A greater first angle θ1 provides the outlet gas at a smaller angle with respect to vertical, see the angle A of FIG. 2C above. Thus, the directional portion 312B of the partition 312 provides a channel that traverses obliquely to a vertical axis.

Figure 2F:
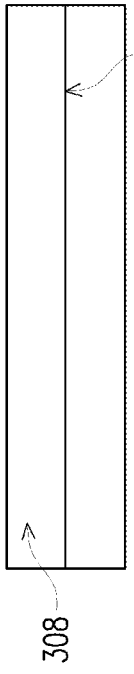
Figure 2G:
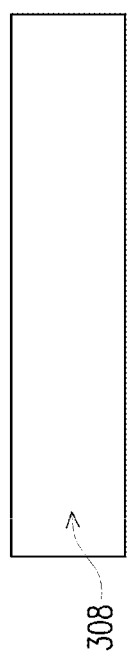
Figure 2H:
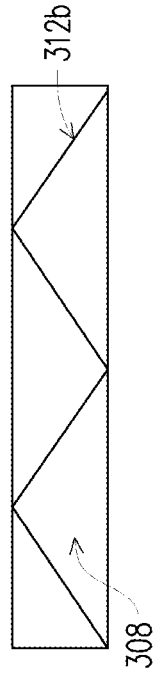
Figure 2I:
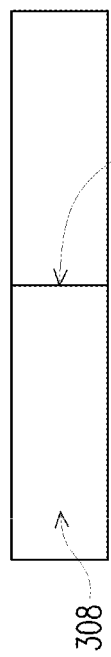

As discussed above, in an embodiment, the outlet opening 308 contiguously extends the length L1 of the control device 304 at a width w3 such as illustrated by the cross-sectional view of FIG. 2F. In other embodiments, the partition 312 includes sub-portions that restrict the area of the outlet opening 308. FIGS. 2G, 2H, and 2I are illustrative of various configurations that are illustrative of modifying the area of the outlet opening 308. In some of these embodiments, the outlet opening 308 may further be decreased in size (e.g., length or width) including decreased relative to the inlet opening 306 area. FIGS. 2G, 2H, and 2I are exemplary only and not intended to be limited beyond what is specifically claimed. In an embodiment, the sub-portion 312b of the partition 312 further restricts the outflow gas to a portion of the length of the control device 304 as illustrated in FIG. 2G. In an embodiment, the sub-portion 312b restricts outlet opening 308 to a smaller portion, here illustrated as restricting to a first half and a second half along the length L1 as illustrated in FIG. 2H. In an embodiment, the sub-portion 312b restricts opening 308 to a smaller portion, here illustrated as plurality of triangular openings 308. The configuration of the outlet opening 308 may be determined by experimental analysis and/or simulation to determine the configuration that provides the best control of the gas exiting the outlet opening 308. In an embodiment, the modification of FIGS. 2G, 2H and 2I provide a flow rate of the exiting gas from the respective outlet opening 308 that are less than the flow rate of the exiting gas from outlet opening 308 of the device of FIG. 2F.

Figure 3:
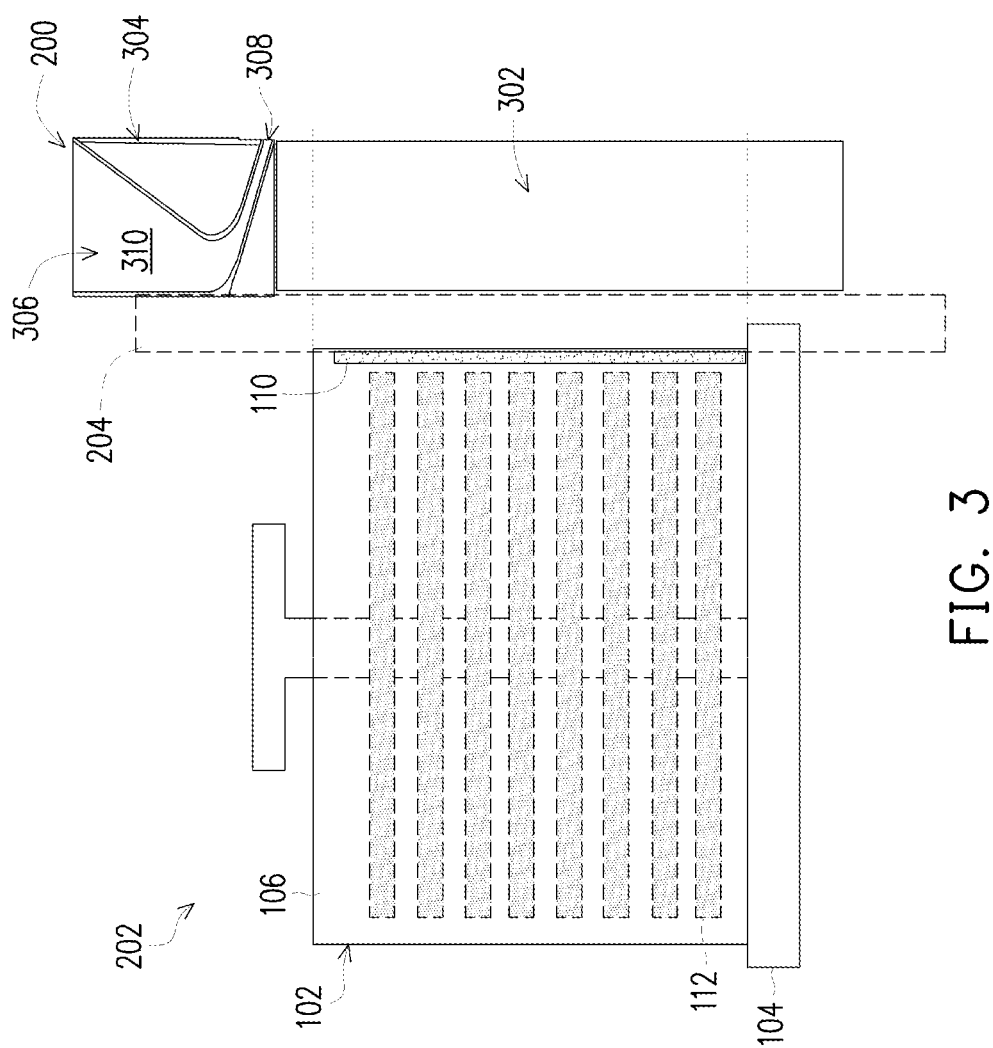
FIG. 3 is a diagrammatic figure of a system having a FOUP and an interrelated air flow optimizer device in accordance with aspects of the present disclosure.

Referring now to FIG. 3, illustrated is a system 202 that provides the air optimization device 200, discussed above with reference to FIGS. 2A-2I, interfacing with the FOUP 102, discussed above with reference to FIGS. 1A and 1B. The system 202 illustrates the air optimization device 200 is positioned adjacent to and aligned with a side of the FOUP 102 that includes the door 110.

In an embodiment, the air optimization device 200 is affixed directly to a FOUP 102, such as the air optimization device 200 physically contacts the FOUP 102. In other embodiments, the air optimization device 200 is affixed an interposing structure 204, which in turn contacts the FOUP 102. In an embodiment, the interposing structure 204 is a portion of a load port, a portion of tool or equipment for processing substrate, a portion of a tool or equipment for measuring substrate; a portion of a tool or equipment for testing a substrate and/or a portion of any enclosure defining a mini-environment (e.g., controlled environment chamber). In the cases where the interposing structure 204 is present, there is a contiguous structure of the FOUP 102, the interposing structure 204 and the air optimization device 200 (e.g., the extension plates 302). In other words, a chamber 106 of the FOUP 102 can be contiguous with a chamber extending from the air optimization device 200.

As is evident the illustration of FIG. 3 and discussed above, the air optimization device 200 is operable to receive down gas flowing down (e.g., vertically) that enters the opening 306 of the air optimization device 200. The received gas is directed through the channel 310 of the air optimization device 200 and exits the opening 308 of the air optimization device 200. When exiting, the air is no longer flowing in a vertical (e.g., down) direction, but extending obliquely away from the FOUP 102. Thus, in some implementations, the air optimization device 200 directs air away from the chamber 106, which is exposed when the door 110 of the FOUP 102 is opened.

Figure 4:
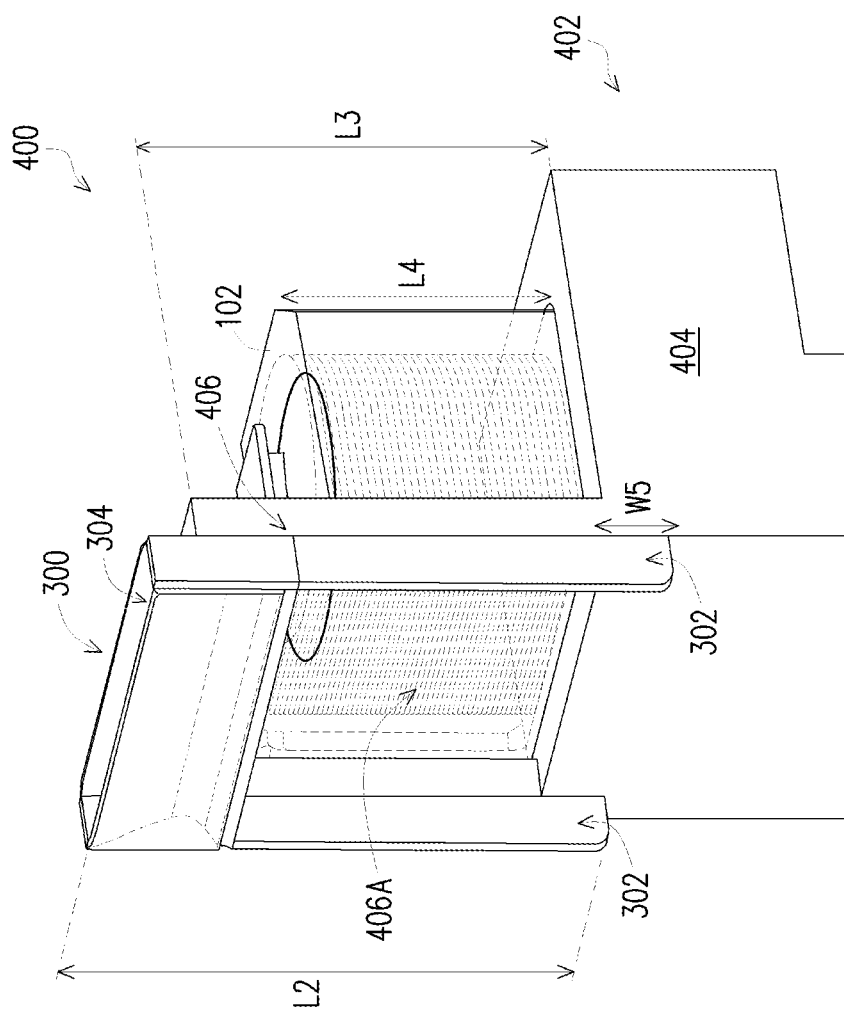
FIG. 4 is a diagrammatic figure of a system including a FOUP, a load port, and an air flow optimizer device in accordance with aspects of the present disclosure.

An embodiment of the illustration of FIG. 3 is provided by the system 400 of FIG. 4. The system 400 includes a FOUP 102 having a plurality of substrates 112 disposed inside and an air optimization device 200. The interposing structure 204 is in an embodiment, a portion of a load port, illustrated as load port 402. As discussed above with reference to FIG. 3, the air optimization device 200 serves to direct down flow gas away from the FOUP 102 and the chamber 106 when the door 110 is opened (as illustrated).

The FOUP 102 may be substantially similar to as discussed above including with respect to FIGS. 1A and 1B. The FOUP 102 is positioned on a load port 402. The load port 402 is configured to hold a FOUP and allow a substrate to be transferred between the inside of the FOUP and the inside of a semiconductor fabrication, measurement, or testing tool (not shown). In an embodiment, the load port 402 is a component of EFEM. The air optimization device 200 is disposed on the load port 402 and affixed to the load port 402. The air optimization device 200 may be substantially similar to as discussed above including with respect to FIGS. 2A-2I.

Figure 5:
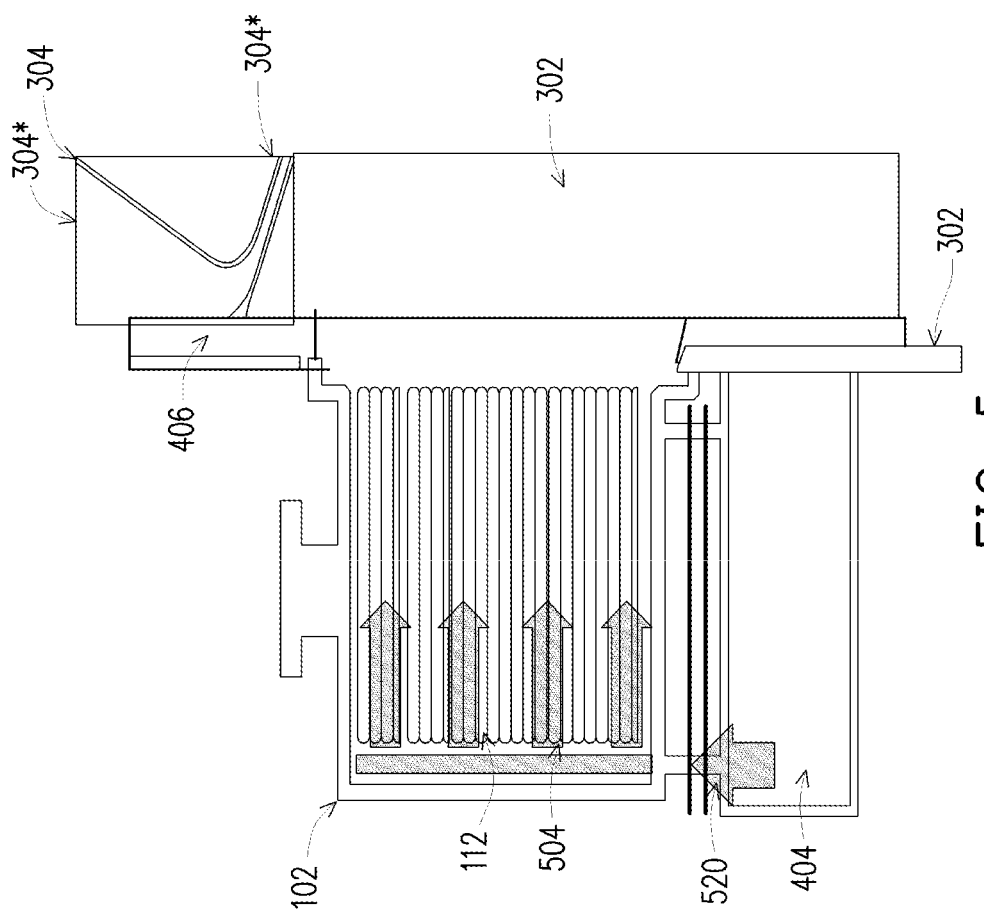
FIG. 5 is a diagrammatic figure of another system including a FOUP, a load port, and an air flow optimizer device in accordance with aspects of the present disclosure.

In some implementations, the load port 402 is a purge load port, for example, providing for an existing gas atmosphere in the FOUP 102 to be replaced with a stream of purge gas such as nitrogen or dry air proved from the load port 402. A stage 404 of the load port 402 includes a purge port through which a gas atmosphere in the FOUP 102 is replaced into nitrogen gas or dry air delivered through the purge port. This is shown in further detail with respect to FIG. 5. As illustrated in FIG. 5, a purge gas 502 is provided from the stage 404 into the FOUP 102 forcing the atmosphere of the FOUP 102 outward horizontally, shown as flow 504. The purge gas 502 and/or the flow 504 may be clean air, nitrogen, other inert gas, and/or other suitable compositions.

A receiving interface portion 406 of the load port 402 is provided in a juxtaposed or perpendicular relationship with the stage 404. The receiving interface portion 406 has an opening 406A, typically covered by a removable door (not shown), that exposes an inside of another, adjacent environment. In some embodiments, the environment is within the semiconductor fabrication, test or measurement apparatus. In some embodiments, the environment exposed by the opening portion 404B is within a EFEM tool. The environments within the fabrication, test or measurement tools and/or within the EFEM system are referred to herein generally as a mini-environment.

In some implementations, a door section provided on the load port 402 and in particular on the receiving portion 406 is brought in close contact with the door 110 provided on the FOUP 102, the door section and the door 110 are opened at the same time and the substrate 112 in the FOUP 102 is supplied into the EFEM or other mini-environment. In some implementations, a door section provided on the load port 402 and in particular on the receiving portion 406 is opened and the FOUP 102 is slid forward slightly into the mini-environment where the door 110 provided on the FOUP 102 is opened, and the substrate 112 in the FOUP 102 is supplied into the EFEM or other mini-environment. In the implementations where the FOUP 102 is slide forward into the mini-environment, it is noted that the FOUP 102 and its door 110 are not traversed past an end of the extension plate 302 of the air optimization device 200. Numerous other configurations of the interfacing of the FOUP and the load port are suitable. After transferring to the mini-environment, the substrate is subjected to various processes and then passed from the mini-environment back into the FOUP 102.

As illustrated in the system 400, the air optimization device 200 is affixed to the receiving portion 406 of the load port 402. In an embodiment, down flow gas is directed away from the FOUP 102 opening.

In an embodiment, the FOUP 102 has a height of L4, the receiving portion 406 of the load port 402 has a height L3, and/or the air optimization device 200 has a height L2. In an embodiment, L2 is greater than L3. In an embodiment, L4 is less than L3. In an embodiment, the extension plates 302 have a length such that there is an overlap of w5 of the extension plates 302 and load port 402 below the FOUP 102. In some implementations, the height L2 and the overlap w5 are selected to provide sufficient protection from adjacent air supplies, such as an adjacent load port 402. In an embodiment, w5 is approximately 4.5 cm. L2 is selected such that the air flow optimizer 200 has an outlet opening 308 that is sufficiently above the FOUP 102 and in particular, above the opening extending from the chamber 106 of the FOUP 102 through the receiving portion opening 406A, thus, avoiding down flow of air entering the FOUP 102.

Figure 6:
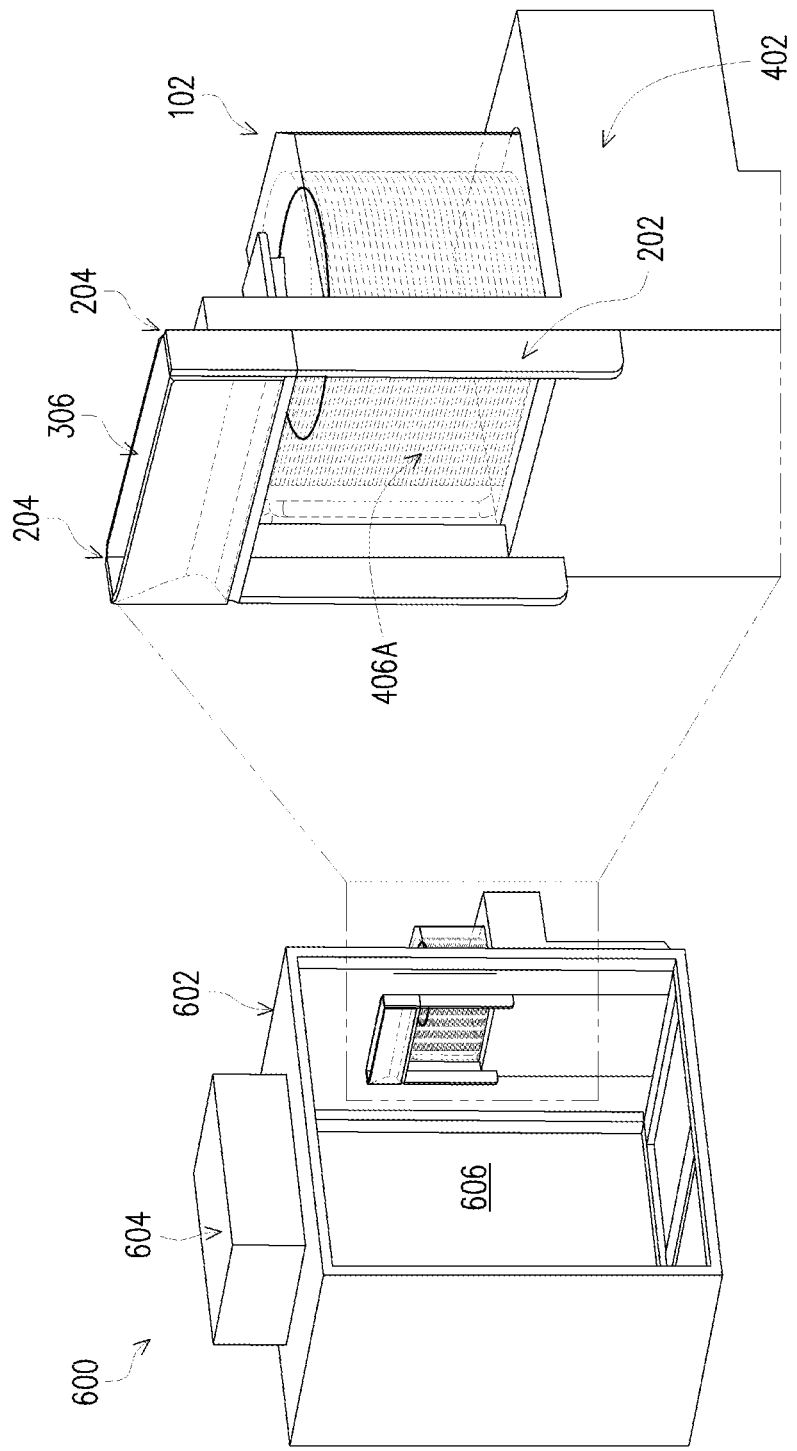
FIG. 6 is a diagrammatic figure of a system including an equipment front end module (EFEM) having a load port, an air flow optimizer device. and a FOUP positioned on the load port in accordance with aspects of the present disclosure.

FIG. 6 illustrates an embodiment of system 600 for processing semiconductor substrates. The system 600 includes an EFEM 602, a mini-environment 606 within the EFEM 602, and a fan filter unit (FFU) 604 positioned for the EFEM 602 to affect the mini-environment 606. FFU 604 may be a type of motorized air filtering equipment capability of removing contaminates or other particles from recirculating air including within the EFEM 602. The FFU 604 may include a plurality of filters.

The FFU 604 creates a vertical down flow of gas within the mini-environment 606 inside of the EFEM 602. The air optimization device 200 is positioned within the EFEM 602 adjacent the load port 402 upon which the FOUP 102 is positioned. The air optimization device 200 is positioned such that it receives through its inlet opening 306 down flow gas originating from the FFU 604. The air optimization device 200 channels the received gas substantially similar to as discussed above, to an output opening 308. The outlet gas exiting the output opening 308 flows in a direction oblique to the vertical air flow from the FFU 604. The outlet gas is output into the EFEM 602 and the mini-environment at a position further away from the opening 406A of the loading port 402. The bottom region of the EFEM 602 may provide for a gas outlet for re-circulation and/or re-filtering of the gas to delivery to the FFU 604.

Figure 7:
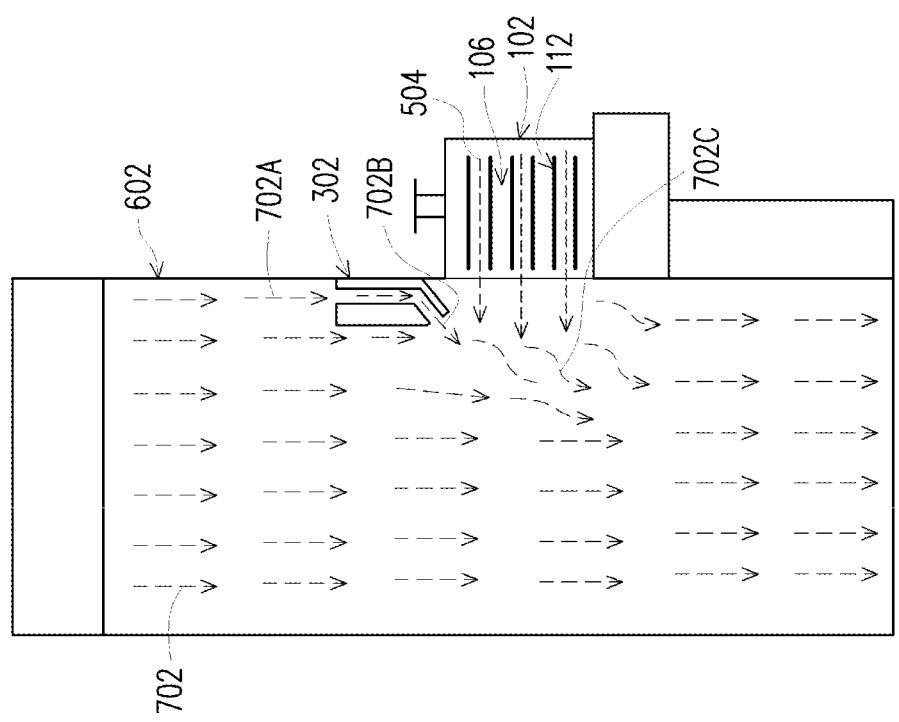
FIG. 7 is a diagrammatic figure of an embodiment of a system including a load port, an air flow optimizer device. and a FOUP positioned on the load port in accordance with various stages of loading the substrates according to aspects of the present disclosure.

FIG. 7 illustrates a schematic view of an embodiment of the mini-environment of an EFEM, such as the mini-environment 606 provided in the EFEM 602 described above with reference to FIG. 6. A down flow of gas 702 is provided from the FFU 604 and delivered within the EFEM 602. In some implementations, the direction of the down flow of gas 702 is substantially vertical as illustrated. A portion of the gas 702, designated gas 702A, is directly above the air optimizer device 200 affixed within the EFEM 602. The gas portion 702A enters the opening 306 of the air optimization device 200 above the interface with the load port opening 706A and/or above the interface with the FOUP 102. The air optimization device 200 re-directs the gas portion 706A to a direction oblique to the flow of the gas 702 including the portion 702A. The outlet gas 702B flows in an oblique direction way from the FOUP 102. The purge gas 502, substantially similar to as discussed above with reference to FIG. 5, flows from the FOUP 102 into the EFEM 602. Because of the directional modification of outlet gas 702B, there is a decreased risk that the gas enters the chamber 106 of the FOUP 102. Thus, the outlet gas 702B has a decreased risk of encountering the substrate 112 within the FOUP 102.

It is noted that the gas flow may continue to be oblique to a vertical direction and mix with the vertical gas flow 702 from the FFU 604, as illustrated by annotated 702C. In some implementations, the flow rate of the outlet gas from the air optimization device 200 affects the amount of air flow 702 within the mini-environment 606 that is affected by the obliquely flowing gas. In some implementations, the flow rate should be sufficient to ensure the down flow gas 702 is mitigated from entering the chamber 106 of the FOUP 102 throughout the height of the FOUP 102.

Figure 8:
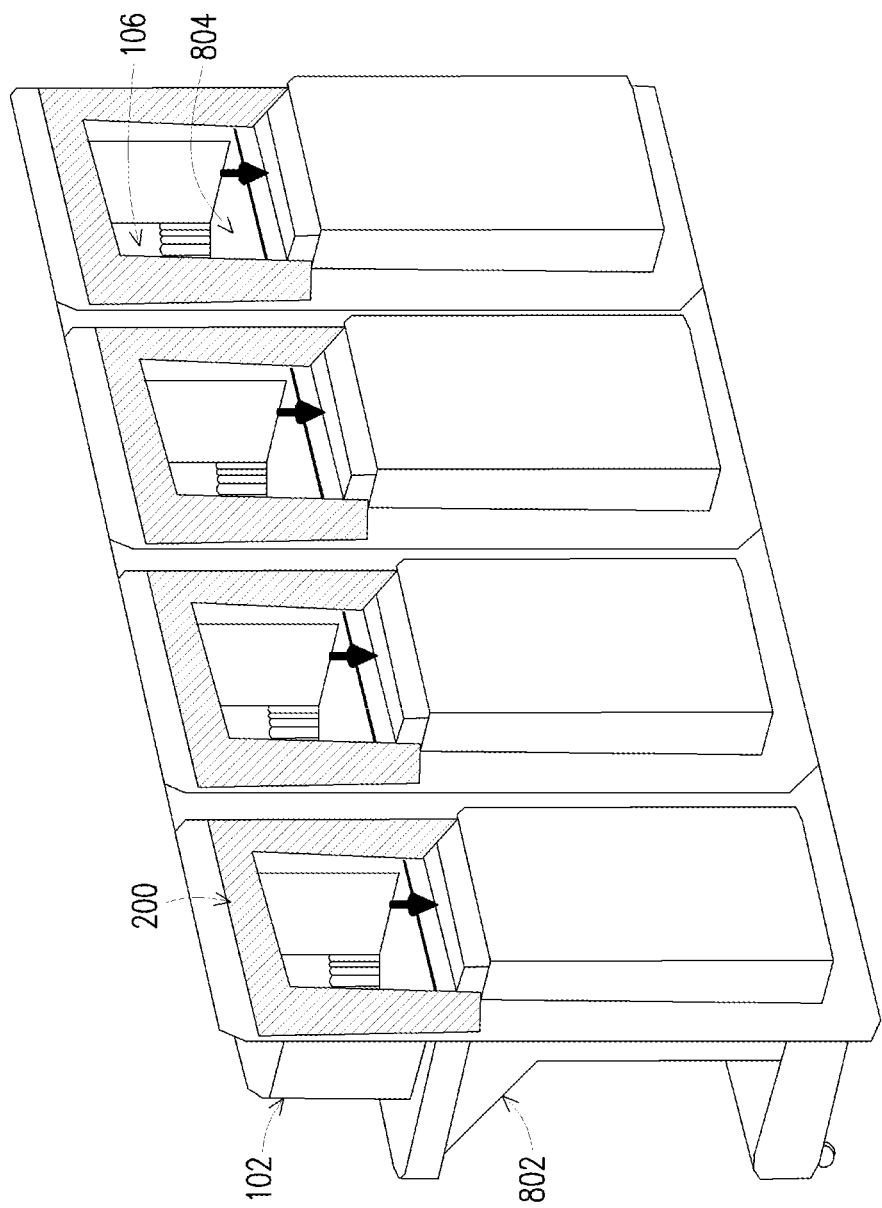
FIG. 8 is a diagrammatic figure of an embodiment of a system including a plurality of adjacent load ports according to aspects of the present disclosure

Referring now to FIG. 8, illustrated is a plurality of load ports 802 disposed adjacent one another. In an embodiment, the plurality of load ports 802 interface a single EFEM, such as the EFEM 602 discussed above. A FOUP such as FOUP 102 may be positioned on each of the plurality of load portions 802. An air flow optimization device 200 is posited on each of the load ports 802. The air flow optimization device 200 includes the extension plates 302. In some implementations as shown, the extension plates 302 can block gas flow from adjacent load port 802 from entering the opening 804 that exposes the chamber 106 of the FOUP 102. In some implementations, the greater the extension plate 302 width, such as width w4 discussed above with reference to FIG. 2D, the more protection is provided to the opening 804.

Figure 9:
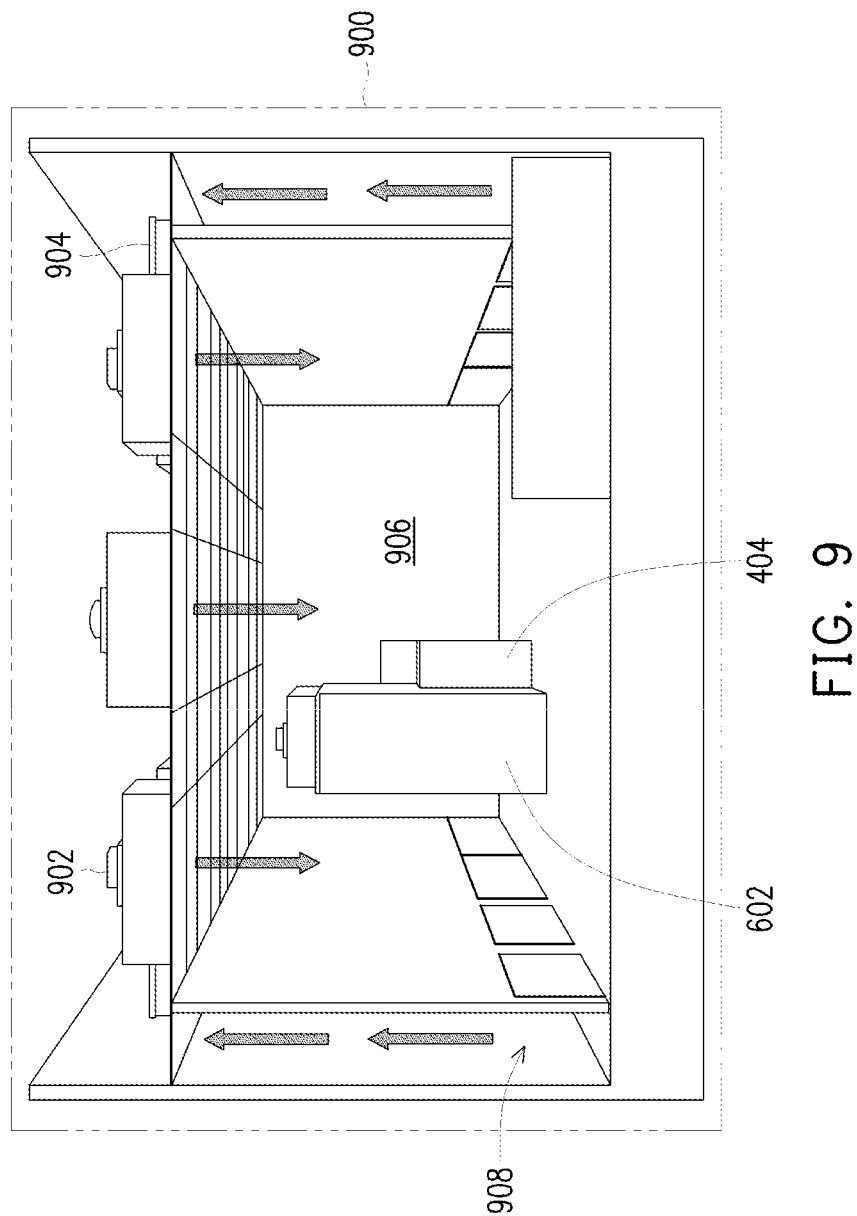
FIG. 9 is a diagrammatic figure of an embodiment of a system including multi-level environments in according to aspects of the present disclosure.

Referring now to FIG. 9, illustrated is a clean room 900. The clean room 900 is an exemplary illustration of a portion of a facility within which production of semiconductor devices such as semiconductor device fabricated on wafers such as substrate 112 discussed above are provided.

The clean room 900 has a plurality of FFU 902 positioned above the fabrication tools and equipment. The FFU 902 may be substantially similar to as discussed above with respect to FFU 604. The FFU 902 deliver vertical, down flow gas 906 into the chamber that is the clean room 900. The vertical down flow gas 906 may be clean air. The down flow gas 906 at the bottom of the clean room 900 is drawn to an outlet passage 908 that re-circulates the gas 906. In some implementations, the clean room 900 includes a plurality of equipment 904 including filters (e.g., chemical or non-chemical), heat producing elements (e.g., ovens) for cleaning and drying the re-circulated gas 906. The equipment 904 may be a part of the FFU 902 and/or separate therefrom.

In some implementations, as discussed above, the air optimization device 200 is positioned to address the down flow gas within the mini-environment of the equipment such as the EFEM 602. However, in other embodiments, the air optimization device such as the air optimization device 200 may additionally or alternatively be used to redirect the down flow gas 906 of the clean room 900.

Figure 10:
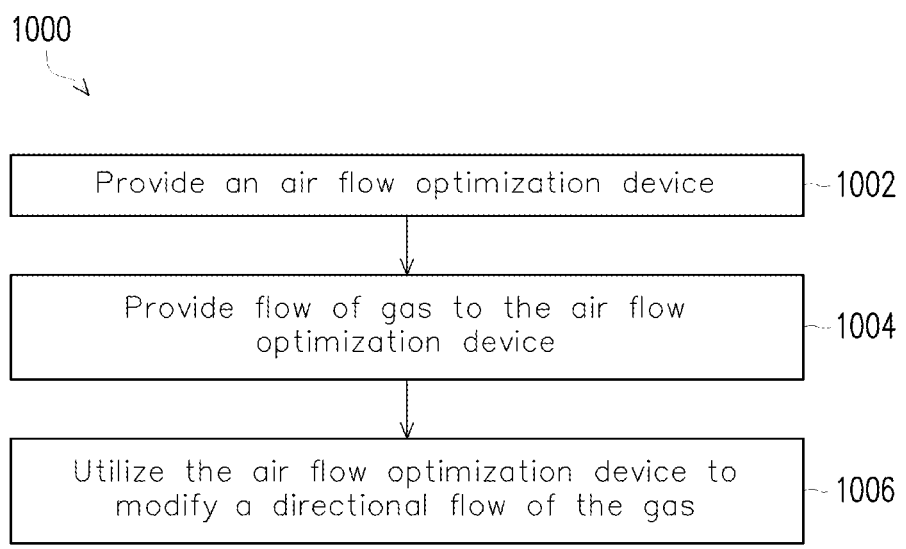
FIG. 10 is a flow chart of an embodiment of a method of modifying a gas flow according to one or more aspects of the present disclosure.

Referring now to FIG. 10, illustrated is a method 1000 for optimizing the flow of a gas. In an embodiment, the method 1000 optimizes the flow of a clean air. In a further embodiment, the method 100 optimizes the flow of gas from a vertical down flow to an oblique flow direction away from a target area. In some implementations, the target area from which the gas flow is directed away from is a FOUP or an open chamber of a FOUP.

The method 1000 begins at block 1002 where an air flow optimization device is provided. In some implementations, the air flow optimization device may be substantially similar to the air flow optimization device 200 discussed above. In some embodiments, the air flow optimization device is provided on a chamber such as a chamber of a EFEM or other semiconductor device fabrication, test, or measurement equipment.

The method 1000 then proceeds to block 1004 where a flow of gas such as clean air is provided to the air flow optimization device. In an embodiment, the flow of gas is substantially vertical in flow. In an embodiment, the flow is provided by FFU such as an FFU of an EFEM, a semiconductor device fabrication, test or measurement equipment, a clean room, and/or an FFU of other environments. The gas may be provided to the air flow optimization device such that it enters an inlet opening such as the inlet opening 306 discussed above.

The method 1000 then proceeds to block 1006 where the air flow optimization device is used to modify the directional flow of the gas. In some embodiments, the directional flow is modified from a vertical down flow to an oblique (e.g., slanted, angled) flow. In an embodiment, the air flow optimization device modifies the directional flow of the air by configuring a passage such as the channel 310 of the air flow optimization device to provide outlet gas at an oblique flow direction. In an embodiment, the air flow optimization device modifies the flow rate of the air by configuring a passage such as the channel 310 of the air flow optimization device to provide outlet gas at higher flow rate than that of the inlet gas. In some implementations, the directional flow of the gas is modified such that the gas is directed away from an opening in a FOUP, such as the FOUP 102, that is interfacing the environment having the air flow. As discussed above, a substrate (e.g., wafer) of the FOUP, such as FOUP 102, may be transferred from the FOUP to the mini-environment including into the mini-environment having the modified directional flow of the gas. In some implementations, the substrate is transferred while the modified directional flow of gas is present. In an embodiment, the method includes providing the modified directional flow of gas prior to opening a door or doors between the interior of the FOUP and the mini-environment.

Thus, the systems, devices and methods described herein in various embodiments provide for controlling (e.g., flow rate and/or directionally) gas flow without a motor or valve. The air flow optimization device such as device 200 provides for re-directing gas flow away from a sensitive component. For example, in some implementation the air flow optimization device re-directs vertical gas flow away from an opening of a FOUP. Inhibiting the introduction of the gas into the FOUP mitigates introduction of additional humidity or contaminates into the chamber, such as chamber 106 of the FOUP 102 and reduces the exposure of the substrates within the FOUP. The air flow optimization device may be positioned in one or more places within an environment to similarly direct vertical air flow away from a risk environment.

Thus, the present disclosure provides in an embodiment a system for semiconductor device processing. The system comprises a front opening universal pod (FOUP) configured to hold one or more semiconductor wafers and a load dock having a stage and a receiving portion extending above the stage. The FOUP is positioned on the stage. A fan filter unit (FFU) positioned above the load dock. An air flow optimizer device is disposed on the receiving portion and under the FFU. The air flow optimizer device has an inlet opening and an outlet opening and a channel extends between the inlet opening and the outlet opening.

In a further embodiment, the air flow optimizer device includes a modification device including the inlet opening and the outlet opening and at least one extension plate extending downward from the modification device. In some implementations, at least one extension plate is longer than the FOUP in a first direction. In an embodiment, the channel decreases in width from the inlet opening to the outlet opening. In an embodiment, one or more semiconductor wafers of the FOUP are operable to be accessed through an opening in the receiving portion. In some examples, the air flow optimizer device is disposed on three sides of the opening. The air flow optimizer device may also include a first extension plate and a second extension plate, and a modification device extending between the first and second extension plates, and the first extension plate is on a first side of the opening, the second extension plate is on a second side of the opening, and the modification device is on a top side of the opening. In an embodiment, the load dock is connected to an equipment front end module (EFEM). In an embodiment, the load dock is an air purge load port.

In another of the embodiments of the present disclosure, a system is provided that includes a front opening universal pod (FOUP) and a load port having the FOUP disposed thereon. The load port provides access to a mini-environment. A device providing a gas flow is disposed above the mini-environment. An air flow modification device is provided that includes a first extension plate, a modification device, and a second extension plate, where the modification device extends between the first extension plate and the second extension plate. The modification device includes an inlet opening and an outlet opening, wherein the inlet opening is configured to accept a gas flow in a vertical direction from the device and the outlet opening is configured to release the gas flow in a second direction, the second direction oblique to the vertical direction.

In an embodiment, the modification device further comprises a channel extending from the inlet opening to the outlet opening. In an embodiment, the channel includes an upper portion extending in the vertical direction and a lower portion extending in the second direction. In some implementations, the inlet opening is smaller in area than the outlet opening. In an embodiment, the first extension plate and the second extension plate have a length in the vertical direction greater than a dimension of the FOUP in the vertical direction. In some implementations, the second direction is approximately 45 degrees from the vertical direction.

In another of the broader embodiments discussed herein, a method of semiconductor device fabrication is provided that includes providing a load port adjacent a mini-environment. The mini-environment includes an air flow optimization device having a first opening and a first outlet. The method includes loading front opening universal pod (FOUP) onto the load port. A gas in the mini-environment is provided to the first opening of the air flow optimization device. The gas is provided in a first direction to the first opening. The directional flow of the gas is modified using the air flow optimization device. The gas is provided in a second direction exiting the first outlet to the mini-environment. A wafer is loaded from the FOUP to the mini-environment having the gas provided in the second direction.

In an embodiment, gas in the first direction has a vertical down flow. In a further embodiment, the second direction is oblique to the first direction. 19. In an embodiment, the gas has a first flow rate adjacent the first opening and a second flow rate adjacent the outlet opening, the second flow rate being greater than the first flow rate. In an embodiment, the gas in the first direction is performed by a fan filter unit disposed above the mini-environment.

Features of several embodiments have been outlined above. Those skilled in the art will appreciate that they may readily use the present disclosure as a basis for designing or modifying other processes and structures for carrying out the same purposes and/or achieving the same advantages as the embodiments introduced above. Those skilled in the art will also realize that such equivalent constructions do not depart from the spirit and scope of the present disclosure, and that they may make various changes, substitutions and alterations to the disclosed embodiments without departing from the spirit and scope of the present disclosure.

What is claimed is:

1. A system for semiconductor device processing, comprising:
   a mini-environment;
   a loading area for semiconductor wafers in the mini-environment, wherein the loading area includes an opening;
   a fan filter unit (FFU) positioned above the loading area and operable provide an air flow in a vertical direction; and
   an air flow optimizer device adjacent the opening and under the FFU, wherein the air flow optimizer device has an inlet opening and an outlet opening, wherein a channel extends between the inlet opening and the outlet opening, the inlet opening operable to accept the air flow in the vertical direction and the outlet opening operable to provide the air flow in an oblique direction away from the opening.

2. The system of claim 1, wherein the air flow optimizer device includes a modification device including the inlet opening and the outlet opening and at least one extension plate extending downward from the modification device.

3. The system of claim 1, wherein the air flow optimizer device is disposed on a wall of the mini-environment.

4. The system of claim 1, wherein the channel decreases in width from the inlet opening to the outlet opening.

5. The system of claim 1, wherein the air flow optimizer device is comprised of aluminum or copper.

6. The system of claim 1, wherein the air flow optimizer device is comprised of a polymer or a ceramic.

7. The system of claim 1, wherein the air flow optimizer device includes a first extension plate and a second extension plate, and a modification device extending between the first and second extension plates, and wherein the first extension plate is on a first side of the opening, the second extension plate is on a second side of the opening, and the modification device is on a top side of the opening.

8. The system of claim 1, wherein the loading area is connected to an equipment front end module (EFEM).

9. The system of claim 1, wherein the air flow optimizer device is positioned over a door of the mini-environment.

10. A system, comprising:
a load port, wherein the load port provides access to a mini-environment;
a device providing a gas flow in the mini-environment;
an air flow modification device comprising:
a first extension plate;
a modification device, wherein the modification device includes an inlet opening and an outlet opening, wherein the inlet opening is configured to accept a gas flow in a vertical direction from the device and wherein the outlet opening is configured to release the gas flow in a second direction, the second direction oblique to the vertical direction; and
a second extension plate, wherein the modification device extends between the first extension plate and the second extension plate.

11. The system of claim 10, wherein the modification device further comprising a channel extending from the inlet opening to the outlet opening.

12. The system of claim 11, wherein the channel includes an upper portion extending in the vertical direction and a lower portion extending in the second direction.

13. The system of claim 10, wherein the inlet opening is smaller in area than the outlet opening.

14. The system of claim 10, wherein the air flow modification device is made of copper aluminum, polymer or ceramic.

15. The system of claim 10, wherein the second direction is approximately 45 degrees from the vertical direction.

16. A method of semiconductor device fabrication, comprising:
providing an air flow optimization device disposed in a mini-environment;
providing a gas in the mini-environment to a first opening of the air flow optimization device, wherein the gas is provided in a first direction to the first opening, wherein the first direction includes the gas having a vertical down flow;
modifying a directional flow of the gas using the air flow optimization device, wherein the gas is provided in a second direction exiting a first outlet of the air flow optimization device to the mini-environment; and
providing a wafer to the mini-environment having the gas provided in the second direction.

17. The method of claim 16, wherein the gas flows from the first opening through a channel to the first outlet of the air flow optimization device, wherein the channel reduces in width providing an increase in flow rate of the gas.

18. The method of claim 16, wherein the second direction is oblique to the first direction.

19. The method of claim 16, wherein the gas has a first flow rate adjacent the first opening and a second flow rate adjacent the first outlet, wherein the second flow rate is greater than the first flow rate.

20. The method of claim 16, wherein the providing the gas in the first direction is performed by a fan filter unit disposed above the mini-environment.

* * * * *